(12) United States Patent
Proell et al.

(10) Patent No.: US 7,752,510 B2
(45) Date of Patent: Jul. 6, 2010

(54) INTEGRATED DEVICE FOR SIMPLIFIED PARALLEL TESTING, TEST BOARD FOR TESTING A PLURALITY OF INTEGRATED DEVICES, AND TEST SYSTEM AND TESTER UNIT

(75) Inventors: Manfred Proell, Dorfen (DE); Stephan Schroeder, Munich (DE); Wolfgang Ruf, Friedberg (DE); Hermann Haas, Hoehenkirchen-Siegertsbrunn (DE)

(73) Assignee: Qimonda AG, Munich (DE)

( * ) Notice: Subject to any disclaimer, the term of this patent is extended or adjusted under 35 U.S.C. 154(b) by 621 days.

(21) Appl. No.: 11/684,533

(22) Filed: Mar. 9, 2007

(65) Prior Publication Data
US 2007/0226591 A1   Sep. 27, 2007

(30) Foreign Application Priority Data
Mar. 9, 2006 (DE) .................. 10 2006 010 944

(51) Int. Cl.
G01R 31/28 (2006.01)
G01R 31/26 (2006.01)
G11C 29/00 (2006.01)

(52) U.S. Cl. .................. 714/724; 714/726; 714/733; 714/734; 324/765; 365/201

(58) Field of Classification Search .................. 714/724, 714/726, 733, 734; 324/765; 365/201
See application file for complete search history.

(56) References Cited

U.S. PATENT DOCUMENTS

| | | | | |
|---|---|---|---|---|
| 5,029,166 | A * | 7/1991 | Jarwala et al. | 714/724 |
| 6,504,359 | B2 | 1/2003 | Polney | |
| 6,894,308 | B2 * | 5/2005 | Whetsel et al. | 257/48 |
| 2002/0157082 | A1 | 10/2002 | Shau | |
| 2005/0098881 | A1 | 5/2005 | Perner | |

FOREIGN PATENT DOCUMENTS

| | | |
|---|---|---|
| DE | 10002831 | 8/2001 |
| DE | 10339787 | 6/2005 |

* cited by examiner

*Primary Examiner*—Kevin L Ellis
*Assistant Examiner*—Guerrier Merant
(74) *Attorney, Agent, or Firm*—Patterson & Sheridan, L.L.P.

(57) ABSTRACT

An integrated device comprises a functional circuit, a test circuit for testing the functional circuit and for providing an error data item and a register element for storing the error data item and for outputting the error data item at an error data output of the integrated device responsive to an output signal. The register element is connected to a data input of the integrated device in order to accept a data item, which is applied to the data input, responsive to the output signal.

5 Claims, 4 Drawing Sheets

INTEGRATED DEVICE FOR SIMPLIFIED PARALLEL TESTING, TEST BOARD FOR TESTING A PLURALITY OF INTEGRATED DEVICES, AND TEST SYSTEM AND TESTER UNIT

CROSS-REFERENCE TO RELATED APPLICATIONS

This application claims foreign priority benefits under 35 U.S.C. §119 to co-pending German patent application number DE 10 2006 010 944.9-35, filed 9 Mar. 2006. This related patent application is herein incorporated by reference in its entirety.

SUMMARY OF THE INVENTION

Embodiments include an integrated device with a functional circuit, a test circuit for testing the functional circuit and for providing an error data item and a register element for storing the error data item and for outputting the error data item at an error data output of the integrated device responsive to an output signal. The register element is connected to a data input of the integrated device in order to accept a data item, which is applied to the data input, responsive to the output signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Several embodiments are explained in more detail below with reference to the accompanying drawings, in which.

DETAILED DESCRIPTION OF THE PREFERRED EMBODIMENT

Figure 1:
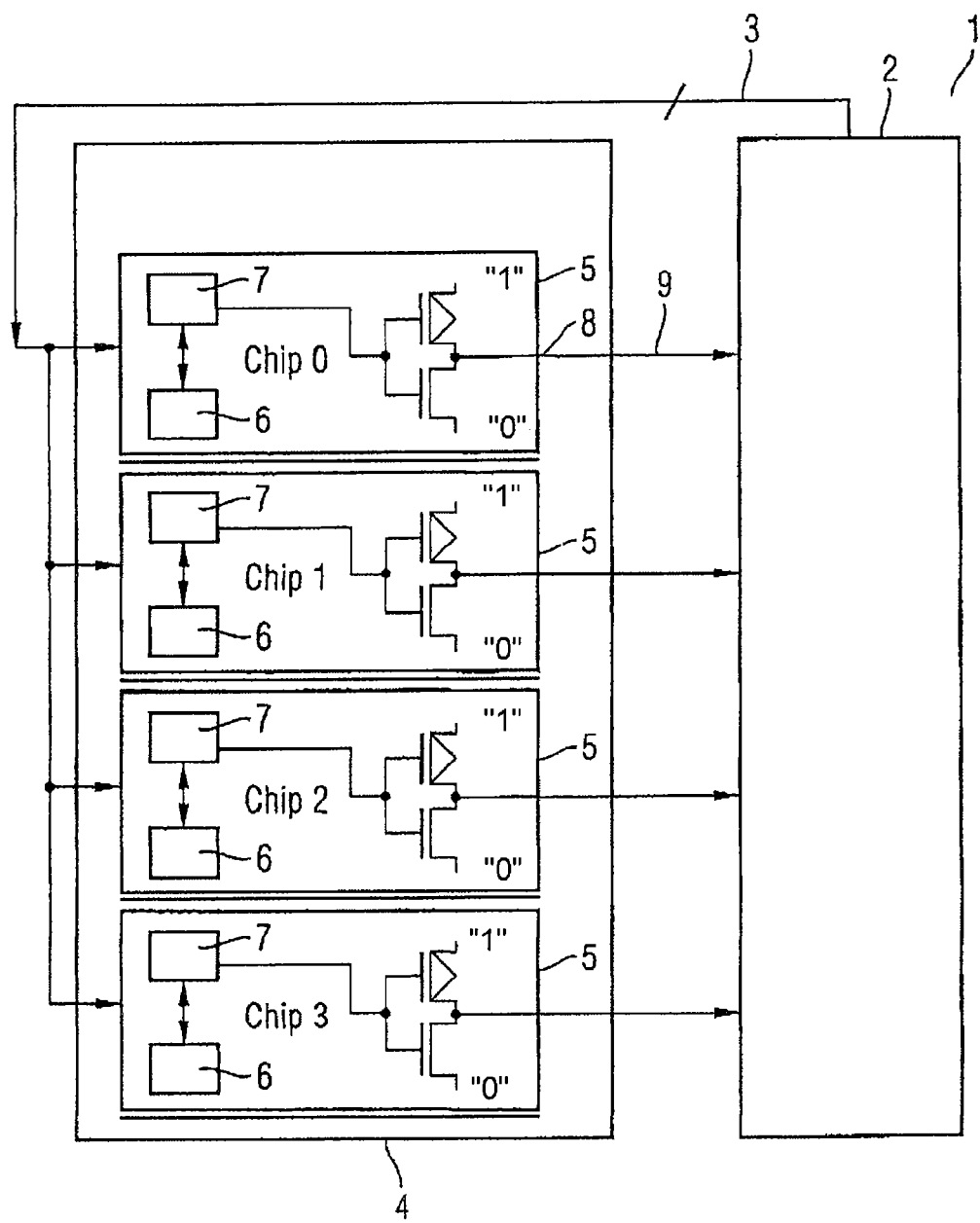
FIG. 1 shows a schematic block diagram of a test system.

FIG. 1 shows a block diagram of a test system 1. The test system comprises a tester unit 2 which is connected to integrated devices 5 on a test board 4 via tester channels 3. The tester channels are used to provide the integrated devices 5 with test input data items in a parallel manner, that is to say each tester channel carries a test input signal which is applied to each of the integrated devices 5 to be tested. All of the integrated devices 5 thus receive the test input signals at essentially the same time. The test input signals may be, for example, command and address signals if the integrated devices 5 are memory devices. In particular, the test operation is started in the integrated devices 5 using the test input signals, that is to say the integrated devices are changed to a test mode, for example.

The integrated devices 5 are preferably identical and generally have a functional circuit 6 and a test circuit 7 which tests the functional circuit 6 in the test mode and outputs a corresponding error data item at an error data output 8 via an error data driver indicated in FIG. 1 as a CMOS inverter. The error data item indicates whether or not an error has occurred. The error data output 8 which can also be used, for example, as a data output in a normal operating mode is connected to the tester unit 2 via a corresponding further tester channel 9. When a plurality of integrated devices 5 are being tested, the error data outputs of the plurality of integrated devices 5 are connected to the tester unit 2 via a respective further tester channel 9.

In the configuration of a test system illustrated in FIG. 1, the number of tester channels required increases with the number of integrated devices 5 which are tested in a parallel manner. Since each device may also have a plurality of error data outputs, a plurality of tester channels may also be provided for each device in order to transmit the error data items to the tester unit 2. The number of further tester channels 9 required for each additional device when testing a plurality of integrated devices 5 in a parallel manner thus increases by the number of error data outputs of the additional device, with the result that the available number of tester channels 3, 9 in the test system have been used up in the case of a particular number of connected integrated devices 5.

Figure 2:
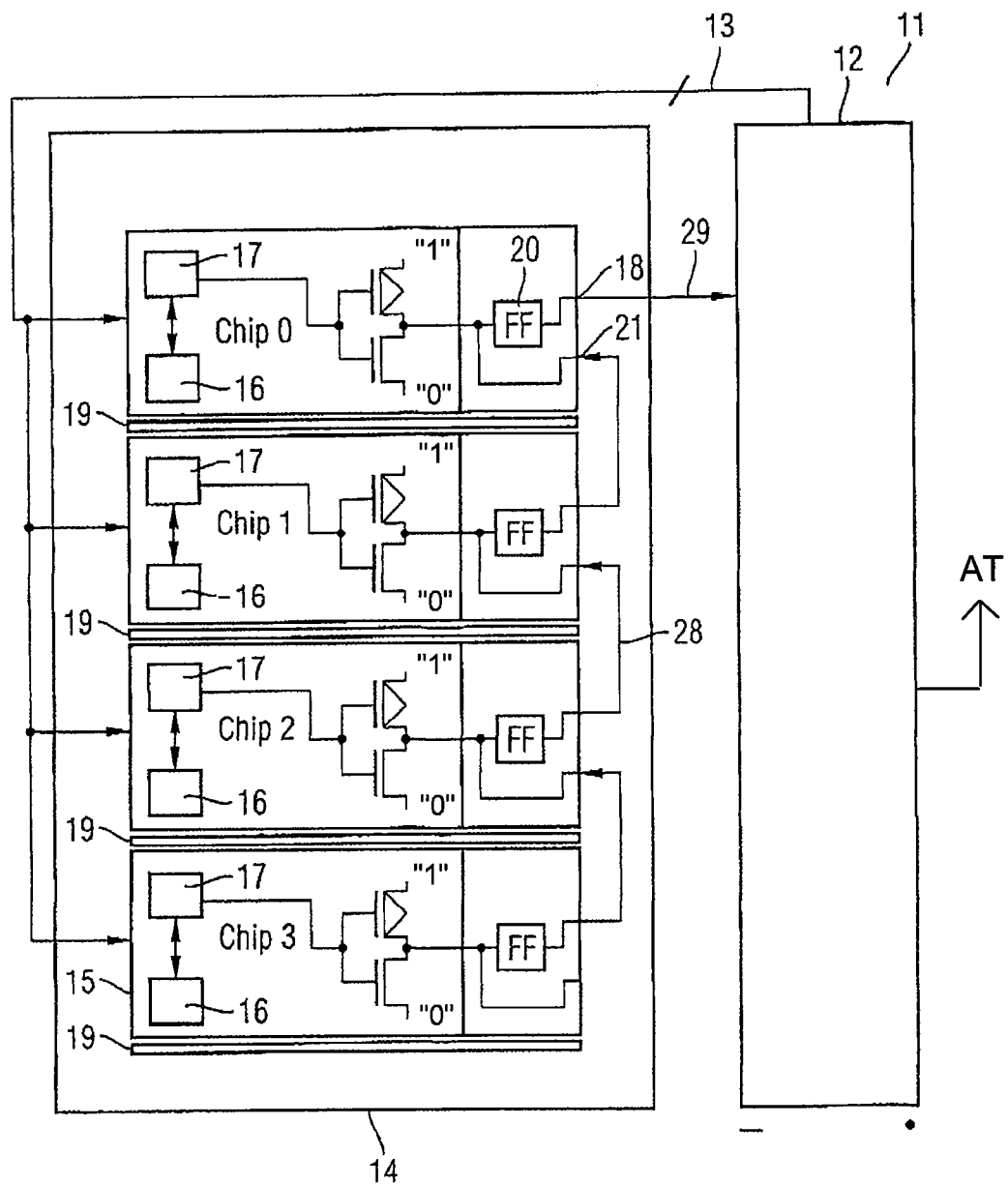
FIG. 2 shows a schematic block diagram of a test system having integrated devices.

FIG. 2 shows a test system 11 which comprises a tester unit 12 and a test board 14 having integrated devices 15 which are to be tested and can be applied to said test board. The integrated devices 15 may be inserted into corresponding connecting elements 19 on the test board 14 in order to test them. The tester unit 12 is connected to the test board 14 and to the integrated devices 15, which have been applied to the latter, in a parallel manner via tester channels 13 in order to provide each of the integrated devices 15 on the test board 14 with test input signals in a parallel manner. As described above with reference to FIG. 1, the test input data items are used to carry out or initiate tests of the integrated devices 15.

The integrated devices 15 each have a functional circuit 16 and a test circuit 17 which provides an error data item as the result of the test. Each of the devices 15 is also configured in such a manner that it has a register element 20 for the error data item provided by the test circuit 17 via an error data driver indicated in FIG. 2 as a CMOS inverter, the error data item being transferred into said register element, for example with reference to a clock signal or asynchronously or the like, after it has been provided and being provided at an error data output 18 of the integrated device.

The register element 20 is also connected to a data input 21. Each of the integrated devices 15 receives, via the tester channels 13, an output signal which is connected to the register elements 20 as an output clock AT. After the test operation in the integrated devices 15 has been concluded by the test circuit 17 or with the assistance of the latter, the test circuit 17 provides an error data item which is transferred into the register element 20. The tester unit 12 then generates the output signal having a plurality of pulses in order to serially read the register elements 20, which have been connected to form a shift register, into the tester unit 12 via a further tester channel 29.

The test board 14 has corresponding line connections 28 between the connecting elements 19, with the result that, when integrated devices 15 are connected, an error data output is connected to the data input of a downstream integrated device 15. The error data output of a last one of the integrated devices 15 in the shift register formed in this manner is connected to the tester unit 12 via the further tester channel 29. The test board 14 thus has connecting elements 19, for example in the form of sockets and the like, which are connected to one another in such a manner that, when integrated devices are connected, the error data outputs are connected to a data input of a downstream device 15.

Figure 3:
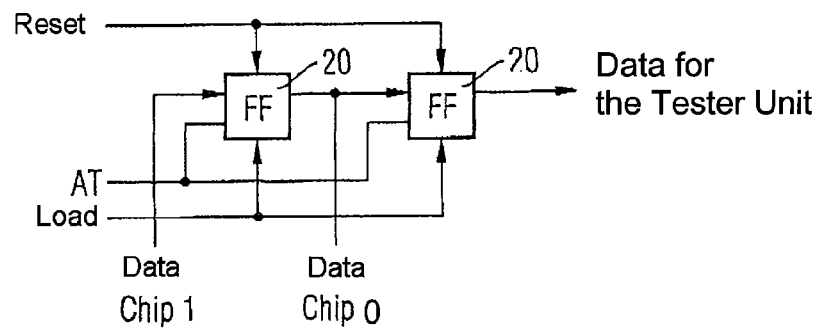
FIG. 3 shows a block diagram of a shift register that is formed by interconnecting the integrated devices.

As illustrated in FIG. 3, the register elements 20 may be formed with the aid of SR flip-flops (that are daisy-chained together) which have a clock input in order to receive the output signal. A logic one can be written to the flip-flop using the corresponding set input of the flip-flop, for example when the test of the corresponding integrated circuit has revealed that the functional circuit is not operating properly, that is to say an error has occurred. Before the test operation begins, the corresponding register elements 20 can be reset with the aid of a respective reset input, with the result that a logic zero is stored in the register elements 20. The register elements may also have a data input (D-type input), the data item which is applied to the latter being transferred into the register element 20 with the aid of the output signal AT. The flip-flops are, for example, a combination of a D-type functionality and an SR-type functionality in a flip-flop. A plurality of successive pulses, in particular a number of pulses corresponding to the number of integrated devices 15 to be tested, make it possible to serially read the error data items determined after the test operation from the shift register formed by the plurality of integrated devices or the register elements 20 in the latter.

Figure 4:
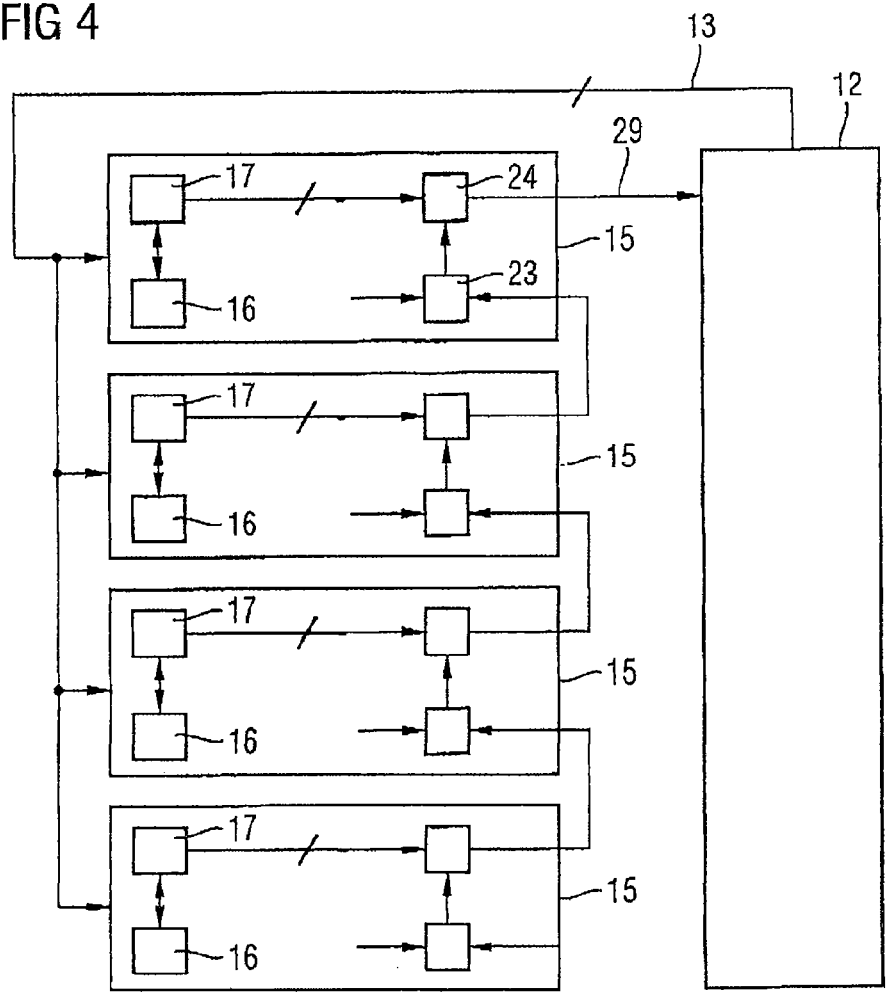
FIG. 4 shows a further test system.

FIG. 4 illustrates an embodiment which essentially differs from the embodiment in FIG. 2 by virtue of the fact that, instead of the one register element 20 in each chip 15, provision is made of two register elements 23 and 24, a first register element 23 and a second register element 24, which are connected in the form of a shift register. A data input of the first register element 23 is connected to the data input of the integrated device 15 and an output of the second register element 24 which is arranged downstream of the first register element 23 is connected to the error data output of the test circuit 17 of the integrated device 15. An error data driver similar to the error data driver shown in FIG. 1 and FIG. 2 may be used. As already described with reference to FIG. 2, the error data output of an upstream integrated device 15 is connected to the corresponding data input of the downstream integrated device 15. In this series of integrated devices 15, the error data output of the last integrated device 15 is connected to the tester unit 12 via the further tester channel 29. Instead of two register elements, it is possible to provide virtually any desired number of register elements in each of the integrated devices, said register elements being connected in a suitable manner in the form of shift registers which can be serially read with the aid of the output signal AT provided by the tester unit 12, the number of pulses in the output signal corresponding at least to the number of register elements 20 in all of the devices 15 to be tested.

Figure 5:
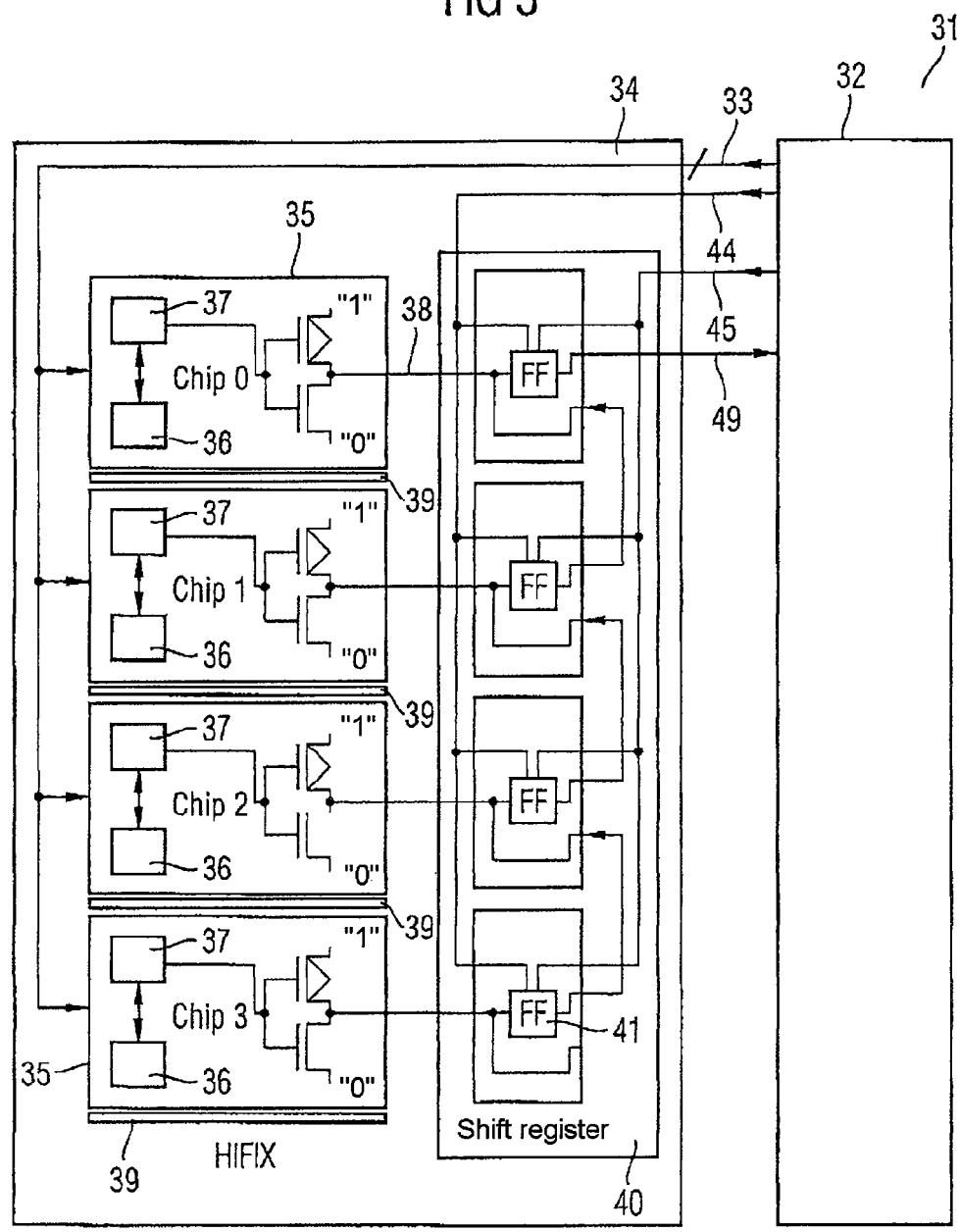
FIG. 5 shows a test system having a test board, which can be used to reduce the number of tester channels required.

FIG. 5 illustrates a test system 31 which essentially differs from the embodiment of FIG. 2 by virtue of the fact that the register elements are not provided in the integrated devices which are intended to be tested but rather are provided separately on the test board. The test system 31 has a tester unit 32 which is connected to integrated devices 35 via a test board 34 and tester channels 33. As in the case of conventional integrated devices, the integrated devices 35 comprise a functional circuit 36 and a test circuit 37 for testing the functional circuit 36 and for providing an error data item which can be output via an error data driver and an error data output 38. The test board 34 has a connecting element 39 for each integrated device 35 which can be connected, said connecting element being able to be in the form of a socket and the like, for example. A shift register 40 having register elements 41 is also provided on the test board, each of the integrated devices 35 or each connecting element 39 being assigned one or more register elements 41 in order to accept the error data item, which is applied to the error data output 38, into the register element 41. The number of connecting elements 39 provided on the test board and corresponding to the number of assigned register elements 41 is essentially arbitrary. A last register element 41 of the shift register 40 has an error data output 42 which is connected to the tester unit 32 via a further tester channel 49. In order to read out the error data items in the shift register 40, the tester unit 32 provides an output signal AT which has a number of pulses, the number of pulses corresponding to the number of register elements 41 of the shift register 40 which are to be read. The output signal AT can thus be used to serially read out the results of a test method, which was carried out in the integrated devices 35 in a parallel manner, into the tester unit 32. In order to transfer the error data items, which are output at the error data output 38 of the integrated devices 35, into the corresponding assigned register elements 41, provision is made of a third tester channel 44 which is connected to each of the register elements 41 and can be used to apply a corresponding acceptance signal. It is also expedient to provide a fourth tester channel 45 in order to apply the output signal AT to the shift register 40.

The integrated devices 35 to be tested may comprise any desired electronic circuits. However, in one preferred embodiment, the integrated devices to be tested are memory devices which, with the aid of applied command and address signals, test a memory area defined by the latter and provide an error data item, which is compressed under certain circumstances, in order to be read out.

The test circuit may be, for example, a BIST (Built-In Self-Test) circuit which automatically tests the memory cell array following appropriate initiation by a test input data item and provides the error data item on the basis of the result of the test. Alternatively, only comparators may be provided as the test circuit 37, said comparators comparing data which have been written to the memory cell array with data which have been read from the latter and, on the basis of the result of the comparison, generating an error data item which is used to indicate the functionality of the memory device.

In order to read the error data items from the shift register formed by the register elements, the tester units described in the embodiments use an output signal which preferably comprises a number of pulses, with the result that, for each applied pulse, the shift register formed by register elements shifts its contents by one place and outputs the contents of the last register element to the tester unit via the corresponding tester channel. On the basis of the number of the pulse of the output signal, the tester unit can determine the integrated device to which the respective received error data item is assigned, with the result that, in the event of the error data item indicating an error, the defective integrated device can be clearly identified. The tester units of the embodiments may initiate a plurality of test operations in the integrated devices, the corresponding register elements preferably being able to be reset before each test operation.

The frequency of the read-out pulses of the output signal may correspond to the frequency of the clock signal used to operate the integrated devices 35 or may be a divided clock signal which is derived there from in order to avoid operating the shift register 40, which is applied to the test board, at a critical frequency.

Another embodiment of an integrated device has a functional circuit, a test circuit for testing the functional circuit and for providing an error data item as well as a register element for storing an error data item and for outputting the error data item at an error data output of the integrated device responsive to an output signal. The register element is also connected to a data input of the integrated device in order to accept a data item, which is applied to the data input, responsive to the output signal.

A number of integrated devices, which are to be tested in a parallel manner, can be connected in series, the test input signals being applied to each of the integrated devices in a parallel manner via common tester channels and an error data output being connected to the data input of a downstream integrated device such that, after a test method which provides an error data item in the corresponding register element in each device has been carried out, the error data items can be serially read from the integrated devices into a corresponding tester unit by applying the corresponding output signal which, in particular, may be in the form of an output clock signal having a plurality of pulses. Arranging the error data outputs of the integrated devices in series can make it possible to connect any desired number of devices in series and to simultaneously test them without increasing the number of tester channels.

A plurality of register elements may be provided in the integrated device, which register elements are connected to form a shift register. The plurality of register elements are connected to the test circuit in order to store a plurality of error data items, the data input being connected to a first one of the register elements of the shift register, and the error data output being connected to a last one of the register elements of the shift register. The shift register is also configured to accept a data item, which is applied to the input, into the first register element of the shift register responsive to the output signal and to output a data item, which is stored in the last register element of the shift register, via the error data output. Furthermore, in the shift register, the data items stored in the latter are shifted in the direction of the last register element in the case of a pulse of the output signal.

In this manner, error data items having a plurality of bits, which indicate a detailed result of the test operation, can also be provided for output to a tester unit without increasing the number of tester channels required. Since the error data items are stored in a shift register in the integrated device and the devices are connected in series with the shift registers, the shift registers of the device are part of the shift register formed by the plurality of devices, with the result that the error data items stored in the shift registers can be serially read out responsive to the output signal.

Another embodiment of a test system can have a plurality of devices, for example a plurality of devices as described above with reference to the Figures. The devices can be connected in series, with the result that the error data output of one of the devices is connected to the data input of a downstream device, the error data output of a last one of the devices which are connected in series being connected to a tester unit. The tester unit provides the plurality of devices with test input signals in a parallel manner and provides the plurality of devices with the output signal a number of times for the purpose of retrieving the error data items in order to successively receive the error data items, which are stored in the register elements of the plurality of devices, via the error data output of the last device.

Another embodiment of a test board for testing a plurality of integrated devices comprises a plurality of connecting elements for connecting the integrated devices. The connecting elements can be configured in such a manner that a respective error data output of the integrated devices, which output can be used to output a respective error data item in a test mode, is respectively connected to a register element of a shift register, which register element is arranged on the test board. The shift register has an output signal input in order to receive an output signal, the error data items in the shift register being able to be serially read out responsive to the output signal.

The plurality of connecting elements respectively can have one or more test data inputs in order to provide the devices, which can be connected, with test input data items.

To each of the plurality of devices may be assigned a plurality of register elements which can be written to in a parallel manner via a plurality of error data outputs of the devices which can be connected.

Another embodiment of a test system has a test board, for example a test board as described above. Integrated devices can be connected to the connecting elements of said test board, with the result that error data outputs of the integrated devices are respectively connected to a register element of the shift register. The test system also has a tester unit which is connected to the test board in order to provide the devices with test input data items for carrying out a test and in order to provide output data items which can be used as a basis for serially reading out the error data items stored in the shift register.

Another embodiment of a method for testing integrated devices comprises the steps of providing the integrated devices with test input signals in order to carry out a test in the integrated devices, providing a cyclic output signal, and serially receiving error data items responsive to the output signals.

Another embodiment of a tester unit is configured for carrying out one of the methodes described above.

While the foregoing is directed to embodiments of the present invention, other and further embodiments of the invention may be devised without departing from the basic scope thereof, and the scope thereof is determined by the claims that follow.

What is claimed is:

1. A test system, comprising:
   a tester unit; and
   a test board including a plurality of integrated devices being connected in series, each integrated device comprising:
   a functional circuit;
   a test circuit connected to the functional circuit for testing the functional circuit and for providing an error data item; and
   at least one register element comprising a control input, a data input and a data output, the data input being connected to the test circuit for storing the error data item;
   wherein the register elements of the plurality of integrated devices are connected in series, wherein a data output of a previous register element is connected to a data input of a subsequent register element and a data output of a last register element is connected to the tester unit, and
   wherein the tester unit is connected to each integrated device for providing the plurality of integrated devices with test input signals and for providing the control inputs of the register elements of the plurality of integrated devices with control signals, the control signals including a first output signal and a second output signal, wherein the first output signal causes the register elements to store the error data items applied in parallel to data inputs of the register elements in the register elements, and wherein the second signal comprises a number of pulses, each applied pulse causing each register element to shift its content to a next register element and the last register element to output its content to the tester unit.

2. The test system as claimed in claim 1, wherein the at least one register element of the plurality of integrated devices comprises at least two register elements comprising a first register element and a second register element connected to form a shift register; at least one of the at least two register elements being connected to the respective test circuit of the corresponding integrated device in order to store a plurality of error data items.

3. A test system for testing a plurality of integrated devices each having a respective error data output to output a respective error data item, the test system comprising:
 a tester unit; and
 a test board, the test board comprising:
 a shift register arranged on the test board and comprising a plurality of register elements for storing the error data items of the plurality of integrated devices, each register element comprising a control input, a data input and a data output, wherein the register elements are connected in series, wherein a data output of a previous register element is connected to a data input of a subsequent register element and a data output of a last register is connected to the tester unit;
 a plurality of connecting elements, each connecting element being configured to connect the error data output of one of the integrated devices to the data input of one of the plurality of register elements,
 wherein the tester unit is connected to each register element for providing the control inputs of the register elements with control signals, the control signals including a first output signal and a second output signal, wherein the first output signal causes the register elements to store the error data items applied in parallel to the data inputs of the register elements via the connecting elements into the register elements, and wherein the second signal comprises a number of pulses, each applied pulse causing each register element to shift its content to a next register element and the last register element to output its content to the tester unit.

4. The test system as claimed in claim 3, wherein each of the plurality of integrated devices is associated with a plurality of register elements which can be written to in a parallel manner via a respective plurality of error data outputs of the integrated devices.

5. A method for testing integrated devices, comprising:
 providing a plurality of the integrated devices with test input signals in order to carry out a test in the integrated devices, the plurality of the integrated devices providing error data items;
 providing a shift register comprising a plurality of register elements for storing the error data items, each register element comprising a control input, a data input and a data output, wherein the register elements are connected in series, wherein a data output of a previous register element is connected to a data input of a subsequent register element and a data output of a last register is connected to a tester unit;
 providing a plurality of connecting elements, each connecting element being configured for connecting a error data output of one of the integrated devices to a data input of one of the plurality of register elements; and
 providing the control inputs of the register elements with control signals, the control signals including a first output signal and a second output signal, wherein the first output signal causes the register elements to store the error data items applied in parallel to the data inputs of the register elements by the plurality of the integrated devices into the register elements, and wherein the second signal comprises a number of pulses, each applied pulse causing each register element to shift its content to a next register element and the last register element to output its content to the tester unit.

* * * * *